(12) United States Patent
Coloma Calahorra et al.

(10) Patent No.: US 7,969,700 B2
(45) Date of Patent: Jun. 28, 2011

(54) ELECTRICAL CIRCUIT FOR PROTECTING PHOTOVOLTAIC SYSTEMS

(75) Inventors: Javier Coloma Calahorra, Sarriguren (ES); Julián Balda Belzunegui, Sarriguren (ES); Luis Muguerza Olcoz, Sarriguren (ES)

(73) Assignee: Ingeteam Energy, S.A., Sarriguren (ES)

( * ) Notice: Subject to any disclaimer, the term of this patent is extended or adjusted under 35 U.S.C. 154(b) by 60 days.

(21) Appl. No.: 12/453,474

(22) Filed: May 12, 2009

(65) Prior Publication Data

US 2009/0279221 A1    Nov. 12, 2009

(30) Foreign Application Priority Data

May 12, 2008   (ES) .................................. 200801358

(51) Int. Cl.
    *H02H 3/14* (2006.01)
(52) U.S. Cl. ............................................. 361/84; 361/88
(58) Field of Classification Search .................... 361/81, 361/88
    See application file for complete search history.

(56) References Cited

U.S. PATENT DOCUMENTS

| | | | | |
|---|---|---|---|---|
| 5,500,052 | A * | 3/1996 | Horiuchi et al. | 136/244 |
| 6,593,520 | B2 * | 7/2003 | Kondo et al. | 136/244 |
| 2001/0023703 | A1 | 9/2001 | Kondo et al. | |
| 2003/0111103 | A1 * | 6/2003 | Bower et al. | 136/244 |
| 2007/0181175 | A1 | 8/2007 | Landis | |
| 2009/0272420 | A1 * | 11/2009 | Kare | 136/244 |

FOREIGN PATENT DOCUMENTS

| | | |
|---|---|---|
| DE | 20 2006 007 613 | 9/2006 |
| JP | 7-177652 | 7/1995 |
| JP | 9-182279 | 7/1997 |
| JP | 2001-68706 | 3/2001 |
| JP | 2005-175370 | 6/2005 |
| WO | 2007/048421 | 5/2007 |

OTHER PUBLICATIONS

Diodes Announces High Efficiency SBR Rectifiers for Solar Panel Market, Diodes Inc., Apr. 2008 [recovered from Internet on Sep. 16, 2010], http://www.diodes.com/_files/news/NPA_solar.pdf.

* cited by examiner

*Primary Examiner* — Danny Nguyen
(74) *Attorney, Agent, or Firm* — Wenderoth, Lind & Ponack, L.L.P.

(57) ABSTRACT

The object of the present invention is to provide a structure for the electrical protection of photovoltaic facilities in the event a photovoltaic generator ($G_1$-$G_p$) is connected with its polarity reversed, for what it includes a protection cell that comprises two connection points (1, 2) at which the photovoltaic generator is connected ($G_1$-$G_p$), at least one device (D) in charge of reducing the voltage of the photovoltaic generator ($G_1$-$G_p$) in the event of polarity reversion, which is connected in parallel between the aforementioned two connection points, at least one element (M) of breakage and/or protection of the photovoltaic generator ($G_1$-$G_p$) serially connected to the preceding elements, minimizing the loading on the aforementioned break and/or protection elements.

6 Claims, 6 Drawing Sheets

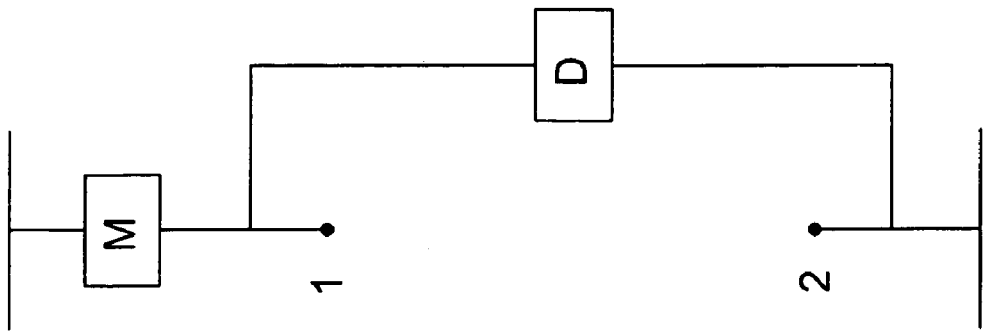
Fig. 5b
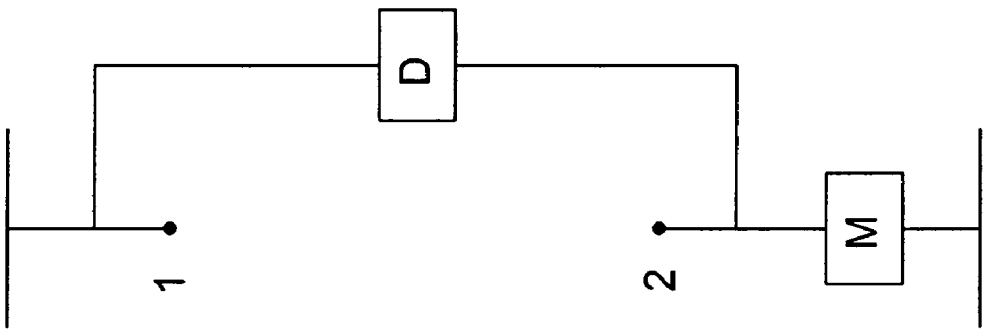
Fig. 5a
Fig. 5

ELECTRICAL CIRCUIT FOR PROTECTING PHOTOVOLTAIC SYSTEMS

OBJECT OF THE INVENTION

The object of the present invention is to provide a structure for the electrical protection of photovoltaic facilities in the event of the reverse connection of a portion of the photovoltaic field, reverse connection being understood as the reversal of polarity in said portion of the photovoltaic field.

The field of application of this invention is the industry dedicated to the design of electrical and/or electronic devices intended for the connection of direct current electrical system and more particularly for the photovoltaic solar energy generation sector.

BACKGROUND OF THE INVENTION

Nowadays, photovoltaic systems enjoy wide recognition in our society, as they are currently used more and more frequently. They are commonly facilities formed by a set of photovoltaic panels, an electronic converter that conditions the energy produced by the photovoltaic panels for its subsequent use and a series of protections and ducting inherent in any electrical installation.

A photovoltaic module or panel is an electrical device that converts the electromagnetic energy of light into electrical energy. This device generates a direct current according to the irradiance that falls on it and the voltage set between its terminals. The characteristic V-I (voltage-intensity) relationship of the photovoltaic module follows a curve in which three characteristic points can be highlighted, as shown in FIG. 1:

$V_{oc\text{-}module}$: the open circuit voltage generated by the photovoltaic module when the current that flows through it is zero.

$I_{sc\text{-}module}$: the short-circuit current generated by the photovoltaic module when the voltage between its terminals is zero.

$V_{mpp\text{-}module}$ and $I_{mpp\text{-}module}$: the voltage and current points where the photovoltaic module generates the maximum power.

$P_{mpp\text{-}module}$: the maximum power generated by the photovoltaic module resulting from the following formula:

$$P_{mpp\text{-}module} = V_{mpp\text{-}module} \cdot I_{mpp\text{-}module}$$

To increase the power generated by the photovoltaic facility, photovoltaic modules may be associated by connecting them to each other in series or in parallel.

The connection of one or more photovoltaic modules in series increases the power of the system by increasing the voltage of the system and keeping the current the same. This association in series of at least one photovoltaic panel is known as a series or string. Thus, if n panels are associated in series, the V-I curve resulting from this association will have as characteristic points:

$$V_{oc\text{-}string} = n \cdot V_{oc\text{-}module}$$

$$I_{sc\text{-}string} = I_{sc\text{-}module}$$

$$P_{mpp\text{-}string} = n \cdot V_{mpp\text{-}module} \cdot I_{mpp\text{-}module}$$

Where:

$V_{oc\text{-}string}$: the open circuit voltage generated by the string when the current that flows through it is zero.

$I_{sc\text{-}string}$: the short-circuit current generated by the string when the voltage between its terminals is zero.

$P_{mpp\text{-}string}$: the maximum power generated by the string.

Another alternative to increase the power is the connection in parallel; in this case, the voltage of the system is kept unchanged and the current increased. The parallel connection of one or several strings is known as a photovoltaic generator. If m strings (strings of n modules) are connected in parallel, the generator formed has a V-I curve with the following characteristics points:

$$V_{oc\text{-}generator} = n \cdot V_{oc\text{-}module}$$

$$I_{sc\text{-}generator} = m \cdot I_{sc\text{-}module}$$

$$P_{mpp\text{-}generator} = n \cdot m \cdot V_{mpp\text{-}module} \cdot I_{mpp\text{-}module}$$

Where:

$V_{oc\text{-}generator}$: the open circuit voltage generated by the generator when the current that flows through it is zero.

$I_{sc\text{-}generator}$: the short-circuit current generated by the generator when the voltage between its terminals is zero.

$P_{mpp\text{-}generator}$: the maximum power generated by the generator.

The photovoltaic field of the facility is obtained from the association in parallel of several of the photovoltaic generators described in the foregoing paragraph, together with their command, monitoring and protection devices ($M_{11}, \ldots, M_{pm}$) (FIG. 2).

Break and/or protection elements ($M_1$-$M_p$) are often included in series with every photovoltaic generator.

Break elements (switches, disconnectors, etc.) allow switching off the current of the generators and are very useful for handling and maintenance operations of the facility. Protection devices (magnetothermal circuit breakers, fuses, etc.) are used to protect generators from surge currents that may damage the facility. If during the parallel connection of the different photovoltaic generators ($G_1$-$G_p$) that make up the facility, the polarity of one of them is inverted by connecting its positive pole to the negative pole of the other generators and its negative pole to the positive pole of the other generators, a reverse current is generated (FIG. 3). In this case, the break and/or protection devices ($M_1$-$M_p$) are subjected to double the voltage of the generator. This loading may even destroy the break and/or protection devices and cause serious personal injuries and material damage in that they are usually dimensioned for the voltage and current of the generator.

In the current state of the art, there are different alternatives to deal with this problem.

A first alternative consists in the use of mechanical electrical-connection elements (connectors) that set a univocal connection between two terminals. Once a cable is bound to its connector by either welding, crimping or screwing-in, there will only exist one possible connection.

The union between cable and connector, however, is frequently carried out at the facility itself, which can bring about the incorrect connection of the cable to its corresponding connector.

Another alternative consists in dimensioning the break and/or protection system for double the voltage of the generator. This is an effective solution but also more expensive, heavy and bulky.

A third option from the state of the art involves preventing the flow of current of the reverse-connected generator by providing each generator with a series-connected diode dimensioned for 2 times the open circuit voltage of the generator (FIG. 4). In normal operation, however, this diode causes electrical losses owing to the voltage drop inherent to the conduction of the diode with the resulting decrease in the performance of the system.

DESCRIPTION OF THE INVENTION

In order to achieve the goals and prevent the inconveniences indicated in previous sections, the present invention provides a new structure for the electrical protection of photovoltaic facilities in the event of the reverse connection of a photovoltaic generator inside a photovoltaic field, reverse connection being understood as the reversion of polarity of a photovoltaic generator of the photovoltaic field.

The proposed structure will comprise at least a protection cell, at which a photovoltaic generator is connected. The protection cell will comprise:

- Two connection points at which the photovoltaic generator is connected.
- At least one device in charge of reducing the voltage of the generator in the event of a reverse connection. This device is connected in parallel between the aforementioned two connection points.
- At least one element of breakage and/or protection of the photovoltaic generator serially connected to the preceding elements.

The cells described above may operate according to two operation modes:

- Normal operation mode: when the photovoltaic generator is properly connected. In this case, the voltage reduction device does not act and the voltage of the system is maintained.
- Reverse operation mode: when at least one of the photovoltaic generators is reversely connected. In this situation, the voltage reduction device acts on said generator by attenuating its voltage and reducing the voltage the break and/or protection device is subjected to.

The advantages of the present invention are:

- The reduction of the need for oversizing the break and/or protection devices. These devices must be dimensioned for the sum of the voltage of the generator and the voltage limited by the voltage reduction device.
- The actuation of the structure exclusively in its reverse operation mode, which represents a step forward with regard to the serially connected diode that permanently causes electrical losses.

The invention provides for:

- The electrical circuit for protecting photovoltaic systems comprising at least two parallel-associated protection cells, at which their respective photovoltaic generators are connected.
- The device in charge of reducing the voltage of the generator comprising a diode or similar element.
- The break and/or protection element being a fuse or the like.

To make understanding this specification easier, and being an integral part thereof, some figures are attached in which the object of the invention, as well as some structures from the state of the art, which have been previously described, is depicted with an illustrative and non-limiting characteristic.

BRIEF DESCRIPTION OF THE FIGURES

FIG. 5.—It depicts a protection cell according to two preferred embodiments of the present invention (FIG. 5a-FIG. 5b).

DESCRIPTION OF ONE OR SEVERAL EMBODIMENT EXAMPLES OF THE INVENTION

A description of examples of the invention, mentioning references from the figures, is given below.

The proposed structure comprises at least two parallel-associated protection cells, at which their respective photovoltaic generators are connected. The protection cell (FIG. 5a) comprises:

- Two connection points (1 and 2) at which each of the photovoltaic generators ($G_1$-$G_p$) are connected. The positive pole of the generator ($G_1$-$G_p$) will be connected at connection point 1, and the negative pole of the generator at connection point 2 for an operation in normal mode.
- At least one device (D) connected in parallel between the aforementioned two connection points (1 and 2) and in charge of reducing the voltage of the generator ($G_1$-$G_p$) in the event of a reverse connection.
- At least one element (M) of breakage and/or protection of the photovoltaic generator serially connected to the preceding elements.

The device (D) in charge of reducing the voltage of the generator in the event of a reverse connection may be of the diode type, and its anode will be connected to connection point 2 and its cathode to connection point 1.

The break and/or protection element (M) may be of the fuse, magnetothermal or similar type and must open the circuit corresponding to the cell in the event of experiencing a surge current therethrough.

These parallel-associated cells allow their respective photovoltaic generators ($G_1$-$G_p$) to be connected ensuring the protection thereof by means of devices dimensioned for their rated voltage and current.

In the event of the proper connection of the photovoltaic generator to one of the cells, the operation mode of said cell will be normal. Diode (D) withstands the voltage of the generator and is locked (zero current).

Figure 1:
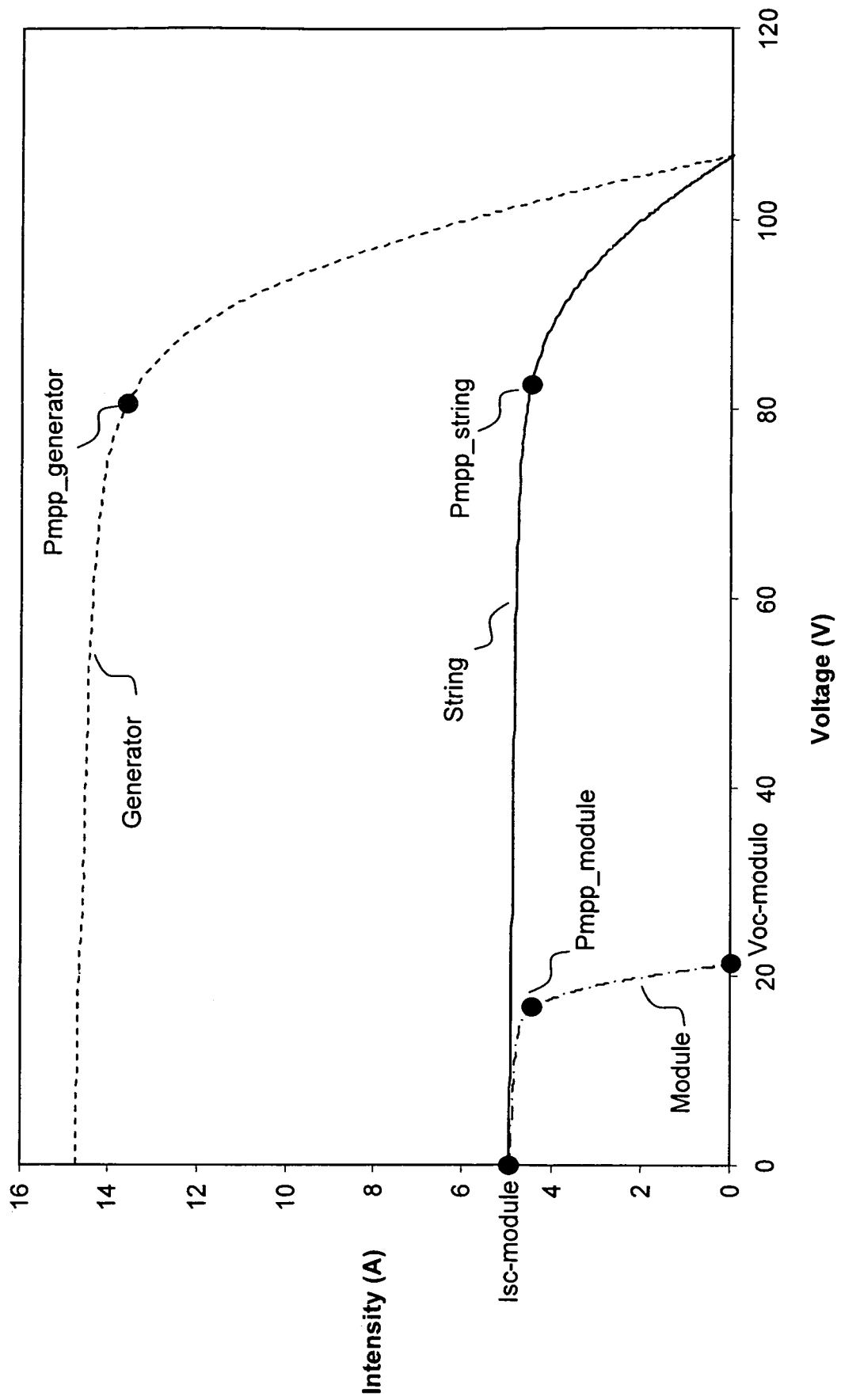
FIG. 1.—It depicts the conventional voltage-intensity (V-I) curve of a photovoltaic module as well as its serial and parallel connections.
Figure 2:
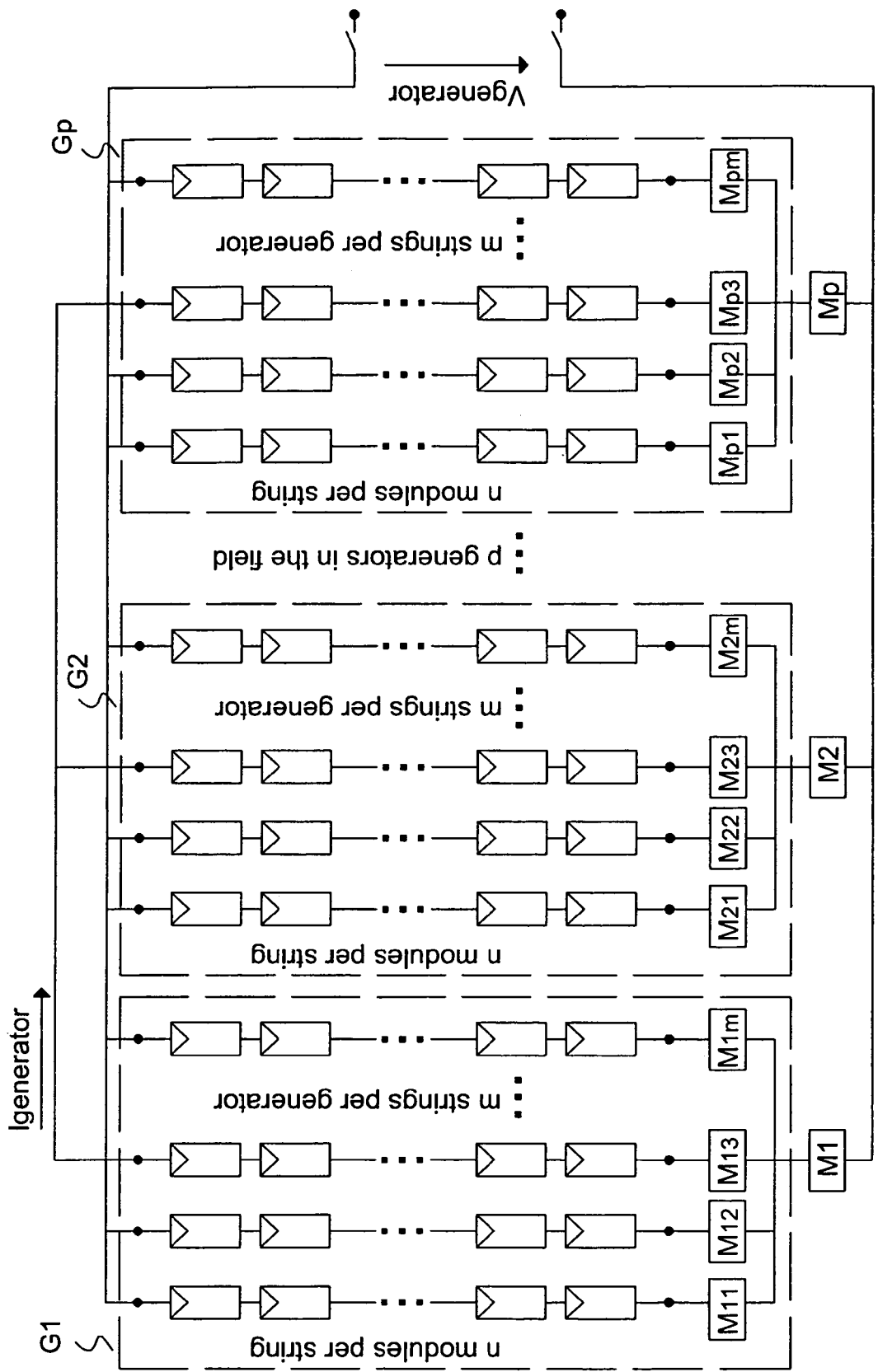
FIG. 2.—It depicts a typical connection layout of a photovoltaic field with command, monitoring and protection elements.
Figure 3:
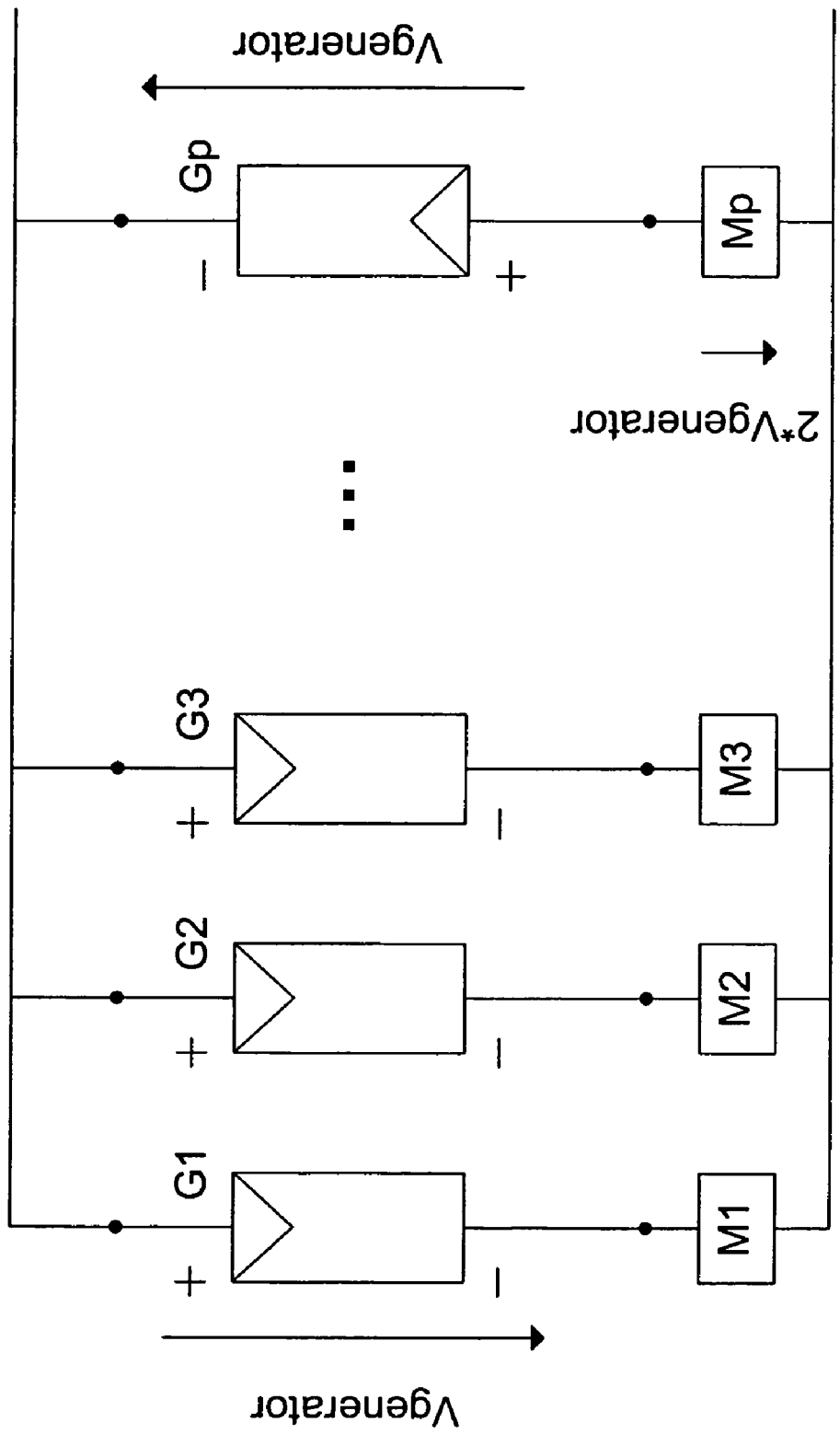
FIG. 3.—It depicts a layout of the improper connection of an electrical generator and the display of the main magnitudes of the system.
Figure 4:
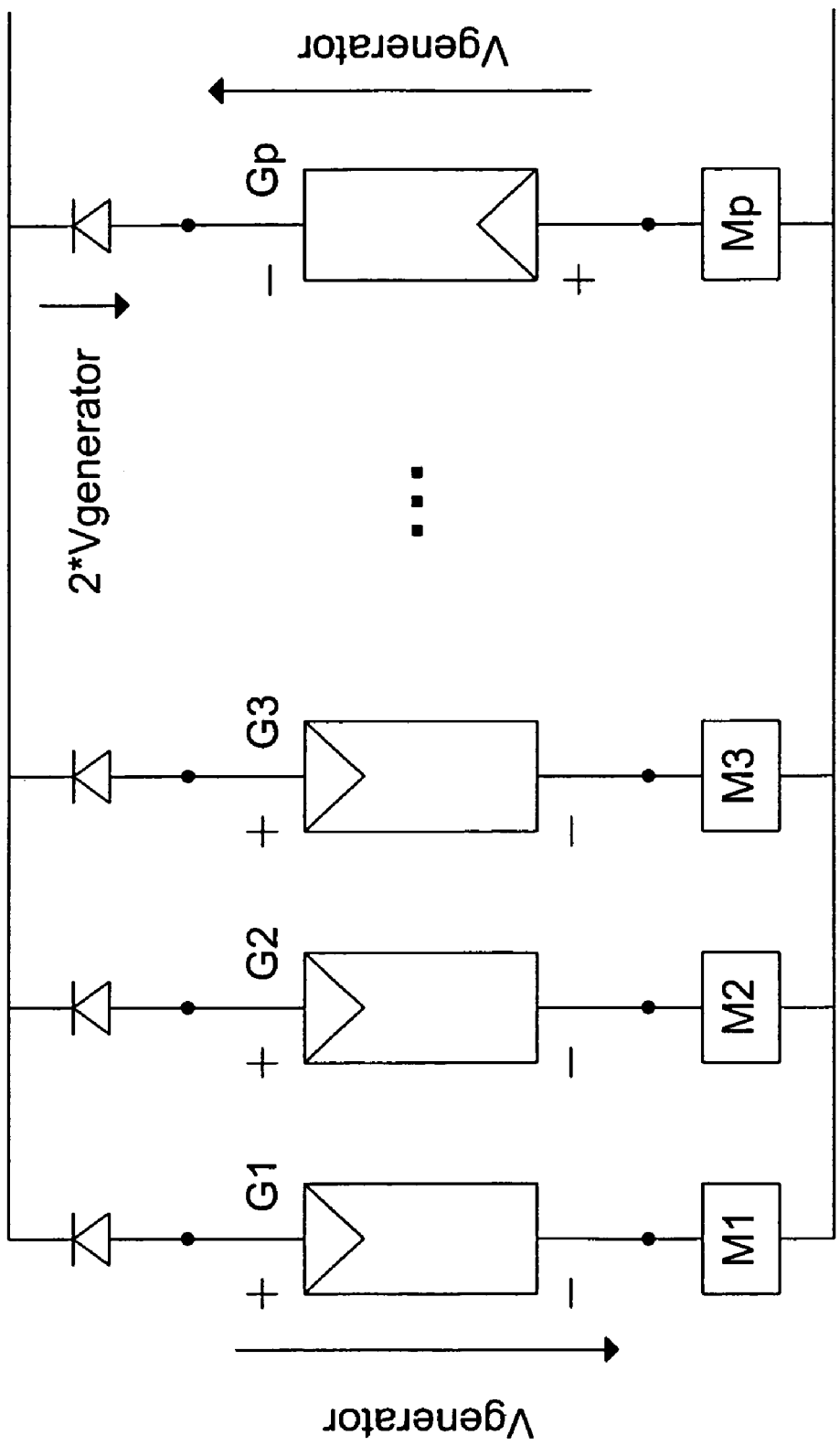
FIG. 4.—It depicts a layout for protecting against improper connections with serially connected diodes according to an alternative of the current state of the art.
Figure 6:
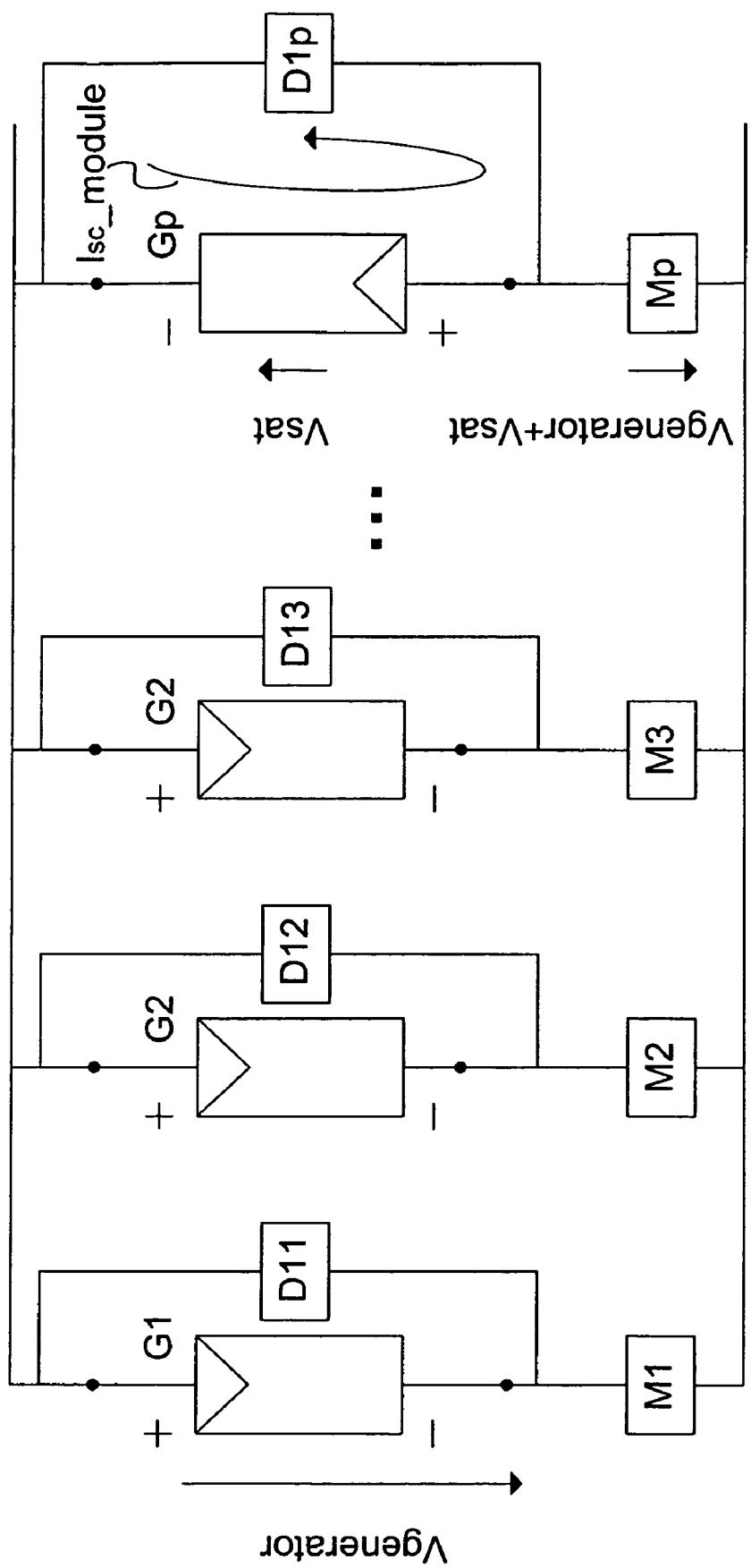
FIG. 6.—It depicts a layout of the improper connection of an electrical generator by means of the structure proposed by the present invention, and the main magnitudes of the system that take place in this invention are depicted.

In the event of a reverse connection of the photovoltaic generator to one of the cells, the diode will take the reverse-connected panel to a point of the V-I curve near that of short circuit (diode saturation direct current and short circuit current-$I_{sc}$-). FIG. 6.

The use of the diode as a voltage reduction element manages to annul the voltage at the terminals of the reverse-connected generator. This allows the break and/or protection device ($M_1$-$M_p$) to be dimensioned for the voltage of the generator.

Another preferred embodiment (FIG. 5b) consists of the same elements of the installation described above but integrates the protection system (M) in the positive pole of the protection cell, which is equivalent to the embodiment described.

The invention claimed is:

1. An electrical system for protecting a photovoltaic system, the electrical system being provided for preventing damage in the photovoltaic system in an event of a reverse connection of a photovoltaic generator inside a photovoltaic field, the electrical system comprising a protection cell,
   wherein the protection cell includes:
      two connection points at which the photovoltaic generator is connected;
      at least one device in charge of reducing a voltage of the photovoltaic generator in an event of a polarity reversion due to the reverse connection, the at least one device being connected in parallel between the two connection points at which the photovoltaic generator is connected; and
      at least one element of breakage and/or protection of the photovoltaic generator, the at least one element of breakage and/or protection being serially connected to the at least one device in charge of reducing the voltage of the photovoltaic generator and the two connection points at which the photovoltaic generator is connected.

2. The electrical circuit according to claim 1, further comprising at least two parallel-associated protection cells, at which their respective photovoltaic generators are connected.

3. The electrical circuit according to claim 1, wherein the at least one device in charge of reducing the voltage of the photovoltaic generator is of a diode type.

4. The electrical circuit according to claim 1, wherein the at least one element of breakage and/or protection is of a fuse type.

5. The electrical circuit according to claim 2, wherein the at least one device in charge of reducing the voltage of the photovoltaic generator is of a diode type.

6. The electrical circuit according to claim 2, wherein the at least one element of breakage and/or protection is of a fuse type.

* * * * *